United States Patent [19]
Granot

[11] Patent Number: 5,117,187
[45] Date of Patent: May 26, 1992

[54] LOCALIZED MULTI-REGION MAGNETIC RESONANCE DATA ACQUISITION

[75] Inventor: Joseph Granot, Holon, Israel
[73] Assignee: Elscint Ltd., Haifa, Israel
[21] Appl. No.: 543,492
[22] Filed: Jun. 26, 1990

[30] Foreign Application Priority Data

Jul. 4, 1989 [IL] Israel .................................. 090862

[51] Int. Cl.⁵ .............................................. G01R 33/20
[52] U.S. Cl. ............................................... 324/309
[58] Field of Search ............ 324/300, 307, 309, 308, 324/310, 311, 312, 313, 314, 318, 322; 128/653 A, 653 R

[56] References Cited

U.S. PATENT DOCUMENTS

| | | | |
|---|---|---|---|
| 4,015,196 | 3/1977 | Moore et al. | 324/309 |
| 4,021,726 | 5/1977 | Garroway et al. | 324/309 |
| 4,531,094 | 7/1985 | Ordidge et al. | 324/309 |

OTHER PUBLICATIONS

*Journal of Magnetic Resonance* "Communications—Selected Volume Excitation Using Stimulated Echoes (VEST) Applications to Spatially Localized Spectroscopy and Imaging" by Joseph Granot.

Primary Examiner—Michael J. Tokar
Attorney, Agent, or Firm—Sandler, Greenblum & Bernstein

[57] ABSTRACT

A multi-slice magnetic resonance (MR) acquisition sequence for acquiring data from a section of interest wherein the sections surrounding the section of interest are presaturated, then multiple slices from the section of interest are selected and data is acquired from the selected multiple slices.

24 Claims, 3 Drawing Sheets

PRESATURATION

LOCALIZED MULTI-REGION MAGNETIC RESONANCE DATA ACQUISITION

FIELD OF THE INVENTION

This invention relates to magnetic resonance (MR) data acquisition and more particularly to methods for spatially limiting the volumes of interest during MR studies either for magentic resonance spectroscopy (MRS) or for magnetic resonance imaging (MRI). Pertinent prior art is listed in two related patents. One of the patents is entitled "A Method for Acquiring In-Vivo Magnetic Resonance Spectroscopic Data", which was issued in the United States on May 23, 1989, as U.S. Pat. No. 4,832,032. The other patent is entitled "Magnetic Resonance Spectroscopic Measurements of Restricted Volumes", which was issued in the United States on Oct. 31, 1989, as U.S. Pat. No. 4,878,021. Both of the aformentioned patents describe inventions by the inventor of the present invention and are assigned to the Assignee herein.

BACKGROUND OF THE INVENTION

When acquiring MR data it is relatively easy to control the slice location and the width of each of the slices. However, when a region or volume of interest is within a selected slice it is more difficult to obtain data from the region or volume of interest and exclude data from the rest of the slice. That is, in-plane localized data acquisition is difficult.

One of the methods of in-plane localization uses surface coils. If the region of interest is a relatively small area, a small coil has to be used to obtain localized data. However, a small coil limits the penetration depth and thereby precludes obtaining multiple slices. If a tumor is located in the head, for example, multiple slices would be used to look at the tumor. To focus on the tumor to the exlusion of extraneous data, a region of interest in each of the slices must be selected. Hence it is important to be able to acquire data from the region of interest in a multiplicity of slices.

There are other prior art methods for selective volume excitation. See for example, a communication in the Journal of Magnetic Resonance, Volume 70, pages 488–492 (1986) entitled "Selected Volume Excitation Using Stimulated Echoes (VEST), Applications to Spatially Localized Spectroscopy and Imaging", written by the inventor herein. In the procedure explained in the communication, a volume of interest is excited using stimulated echoes with Gx, Gy and Gz gradients.

Among the drawbacks of the prior art methods is that none of the prior art methods of selecting volumes of interest (VOI) in the subject within a selected slice are amenable to multi-slice acquisition. Also, many of the prior art methods increase dependence on T2 and/or require complicated programs or extra hardware to implement.

Another of the problems of the prior art used to provide localization of data from a selected slice obtained for MR spectroscopy or imaging are the adverse effects of eddy currents. In the prior art saturation methods are often used in an attempt to minimize the eddy current problems where spins in volumes outside the VOI are saturated and the VOI is left unsaturated. It has been found that methods that saturate volumes outside the VOI has the advantage of minimizing eddy current problems. Saturation methods are especially helpful where large volumes do not have to be saturated. For example, in head imaging or limb imaging, the saturation methods are extremely useful and advantageous.

Accordingly, there is a need for improved magnetic resonance spatial localization methods using saturization tion effects in obtaining magnetic resonance data of sections of interest in selected slices in a multi-slice selecting sequence for spectroscopy and for imaging.

BRIEF DESCRIPTION OF THE INVENTION

According to a broad aspect of the present invention, a method for acquiring data from a restricted section of each slice in a multi-slice magnetic resonance acquisition sequence is provided, said method comprising the steps of:

a) determining a section of interest in a subject of a magnetic resonance (MR) examination, b) presaturating sections surrounding the determined section of interest to restrict the section from which data is acquired to the determined section of interest, c) selecting multiple slices from the determined section of interest, and d) acquiring data from each of said selected multiple slices.

According to a feature of the present invention, a section or volume of interest is determined using such things as a prior diagnostic imaging examination or an MR pre-scan to determine the locality of the section of interest.

According to another feature of the invention, sections of the subject surrounding the determined section of interest are presaturated, said presaturation is accomplished by the steps of:

applying a first of two 90° RF pulses during the application of a first gradient pulse to saturate unwanted regions in a first direction, and applying a second of two 90° RF pulses during the application of a second gradient pulse to saturate different unwanted sections in a second direction.

According to yet another feature of the present invention the invention includes the steps of selecting multiple slices (slabs) from the section of interest said selecting step comprises subjecting the patient under examination to a strong static magnetic field, applying a basic data acquisition sequence to obtain data from a selected one of said multiple slices, said basic sequence including the application of an RF pulse in the presence of a gradient pulse, said pulses having parameters for selecting a first region in said patient, waiting a definite period before reapplying said basic sequence, and reapplying the basic sequence during the definite period with pulses of different parameters for selecting other slices and acquiring data from said other slices in said patient during said definite period.

According to an aspect of the invention, the different parameters include different frequencies for said RF pulse and/or include gradient pulses of different values.

According to yet another feature of the present invention, the different parameters include different bandwidths for said RF pulses.

The method also includes the steps of applying multiple RF pulses of different frequencies to select multiple slices in the patient and applying a plurality of RF pulses of the same frequency to obtain a plurality of signals for each of the multiple RF pulses and averaging said plurality of signals to obtain useful signal-to-noise ratios.

According to yet another feature of the present invention the sets of 90° RF pulses used for saturation purposes are sets of frequency modulated 90° RF pulses.

According to another feature of the present invention means are provided for overcoming the eddy current effects and for providing section of interest that are volumes having efficiently and effectively defined boundaries, that are not plagued by T2 time dependancies and, therefore, are useful for collecting data even when the time periods T1 are especially short.

According to another aspect of the present invention there is included the step of applying spoiler gradient pulses after at least some of said RF pulses.

BRIEF DESCRIPTION OF THE DRAWINGS

The above mentioned and other features and objects of the present invention will become more readily apparent when the invention is considered in the light of the following description made in conjunction with the accompanying drawings; wherein.

GENERAL DESCRIPTION

Figure 1:
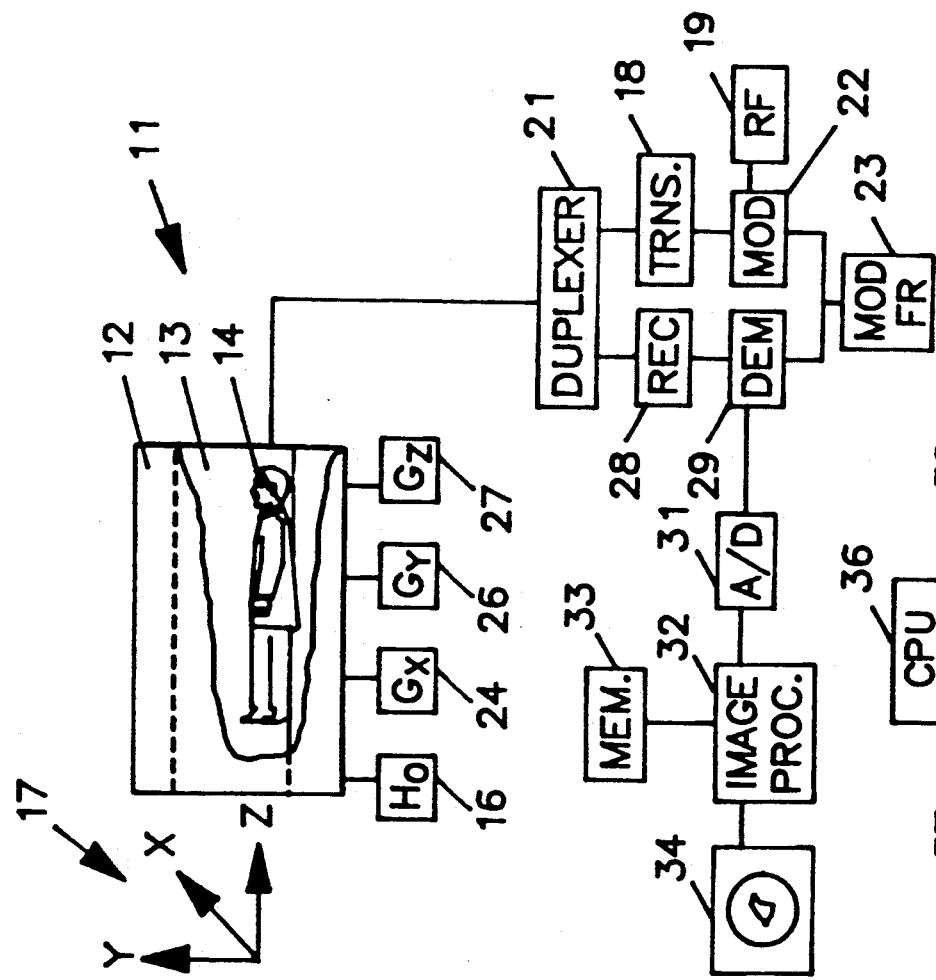
FIG. 1 is a block diagram of an MR data acquisition system using the invention.

FIG. 1 at 11 shows a magnetic resonance system for use either in acquiring magnetic resonance spectroscopic (MRS) data or magnetic resonance imaging (MRI) data in accordance with the present invention.

More particularly, FIG. 1 includes a magnet 12 used to generate a large static magnetic field. The magnet is sufficiently large to have a bore 13 therein capable of accommodating a patient 14 horizontally disposed inside the magnet. The magnetic field is produced by the magnetic field generator HO designated by the reference numeral 16. In a preferred embodiment, a superconducting type magnet is used. However, the instant invention is not limited to super-conducting type magnets.

Permanent magnets or electro-magnetic magnets may also be used within the scope of the present invention.

According to present invention the magnet is shown oriented in relation to an XYZ coordinate system shown at 17. As shown, the longitudinal axis of the bore of the magnet lies along Z axis.

It is well known that when a patient is in the magnet with the large static magnetic field applied to the patient, certain nuclei in the patient called "spins" tend to align themselves with the large static magnetic field.

Means are provided for "tipping" the aligned spins into the transverse XY plane. More particularly, a radio frequency transmitter 18 is provided. The radio frequency transmitter obtains its radio frequency signal from an RF generator 19. The transmitter applies radio frequency pulses through a duplexer 21 to a coil, not shown, in the magnet. The pulse in the instant invention is preferably sinc shaped. The shaping is accomplished with a modulator 22. The modulator receives its modulation frequency from modulation frequency generator 23. The sinc-shaped radio frequency pulse is applied to the coil and is of sufficient magnitude to tip the spins 90° into the XY plane. The spins may be only partially tipped towards the XY plane; the important thing, however, is that there is at least a projection of the tipped spins in the XY plane. The tipped spins in the XY plane precess at what is known as the Larmor frequency and thereby generate what is known as a "free-induction decay (FID) signal". The signal decays rather rapidly due to dephasing of the spins in the XY plane and also due to the tendency for the spins to return to alignment with the large static magnetic field.

To determine the location of the source of the FID signals gradient pulses are used. Thus, there is shown, a GX gradient pulse generator 24, a GY gradient pulse generator 26 and a GZ gradient pulse generator 27. The gradients are applied during the acquisition sequence to aid in determining the exact location of the FID signals. The location is determined by the relationship between the Larmor frequency and the strength of the magnetic field acting on the spins. The relationship is:

$$f = \gamma B_o / 2\pi$$

where:
 f is the Larmour frequncy in KHz,
 $\gamma$ is the gyromagnetic ratio that is constant for each element,
 $B_o$ is equal to the strength of the static magnetic field, and
 $\pi$ is the well known constant 3.1416+.

From the Larmor relationship it is apparent that the frequency is a direct function of the strength of the magnetic field $B_o$. By utilization of the gradient pulses the magnetic field strength and hence the frequency of the received signal is controlled per location in the magnet. Accordingly, the location of the received FID signal is determined by the frequency of the received signal.

The FID signal is transmitted through the duplexer 21 by the receiver 28. The received signal is demodulated in demodulator 29 and the analog demodulated signal is converted to digital signals in the A/D converter 31. The digital signals are processed in processor 32 which may use memory 33 to provide either graphic or imaging data on monitor 34.

The various operations of the system 11 are controlled by a central processing unit (CPU) shown at 36. The central processing unit for the sake of clarity is not shown connected to the other units. However, it controls the timing, amplitudes and shapes of the control signals in the system and thus the CPU is connected to virtually every block of the system. The CPU of the present system is different than that of prior art systems, among other ways, because it includes controls for both presaturation and multi-slice operation as indicated at 37 and 38 respectively.

Figure 2:
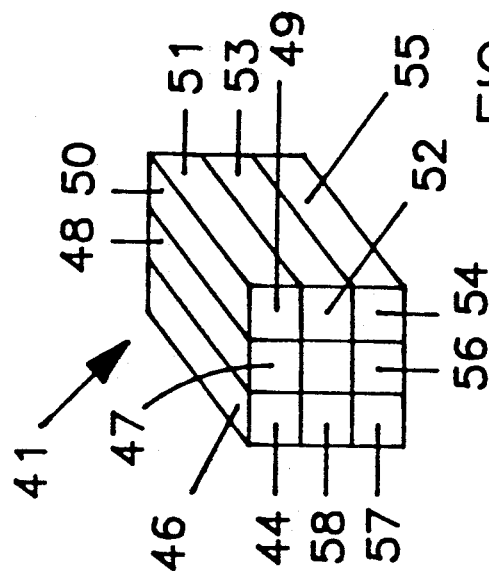
FIG. 2 shows a three-dimensional block of the subject of the MR acquisition scan sequence including a section or volume of interest.
Figure 2A:
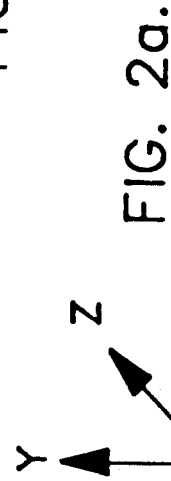
FIG. 2a shows X, Y and Z coordinates oriented with relation to the three-dimensional block of FIG. 2.

The three-dimensional block 41 in FIG. 2 represents a three-dimensional section of the patient 14. The block 14 includes a section or volume of interest (VOI) 43 having a front face 42. It is an aim of the system described herein to obtain multi-slices of the VOI 43 shown in FIG. 3.

To acquire data limited to section 43, a presaturation step is accomplished to saturate all the block 41 except for the VOI 43. More particularly, the volumes having a face 44 and a top surface 46, having a face 47 and a top surface 48; having a face 49, top surface 50 and a side 51, having a face 52 and a side 53; having a face 54 and a side 55; having a face 56, having a face 57, and having a face 58 are saturated to assure that signals are obtained only from the VOI 43.

Figure 3:
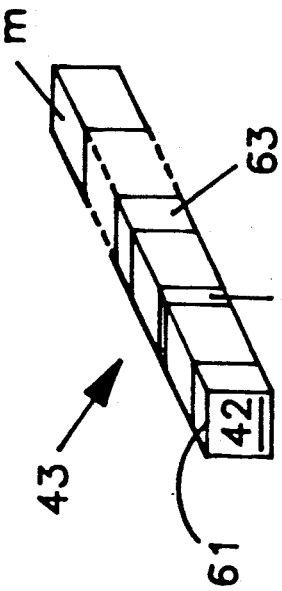
FIG. 3 shows details of the volume of interest taken from the three-dimensional section of FIG. 2.

Preferably, the data acquired from VOI 43 will be data from mutli-slices shown by way of example as slices 61, 62, 63, and 64 in FIG. 3. Fewer or more slices can be used for data acquisition purposes. The data according to the present invention can either be spectroscopic data or imaging data.

Figure 4:
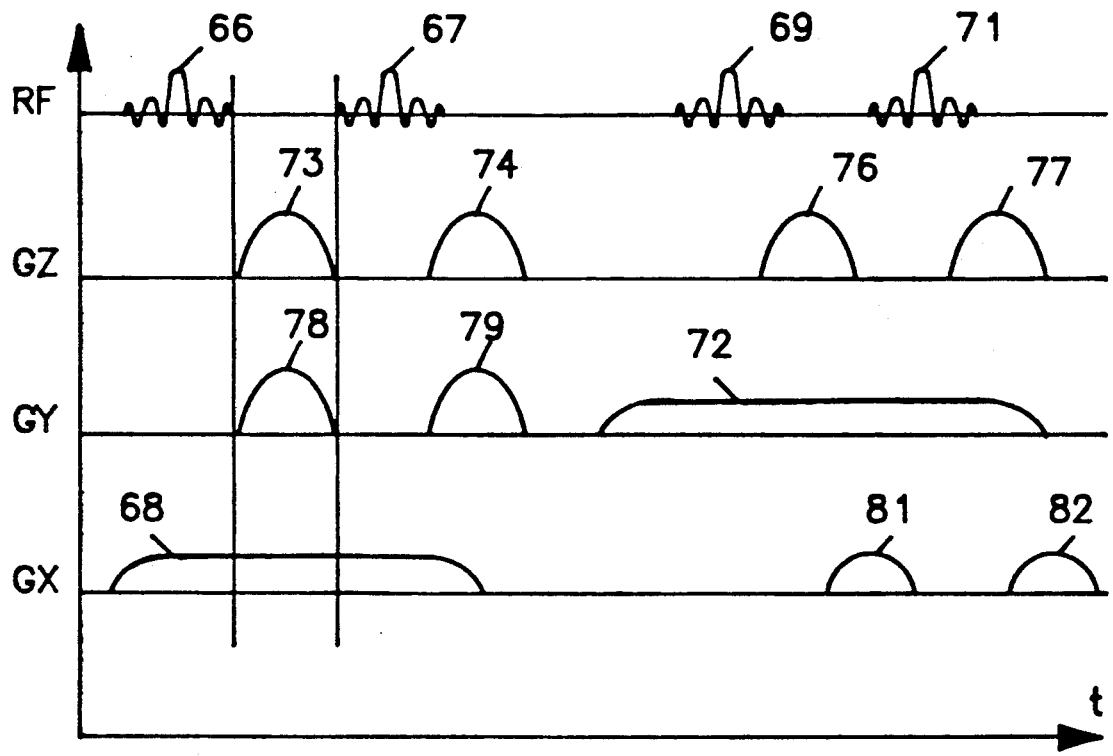
FIG. 4 generally shows a presaturation scan sequence.

In accordance with the present invention, the presaturation is accomplished using a sequence such as shown in FIG. 4. Therein a first pair of ninety degree RF pulses, pulses 66 and 67, are applied sequentially during the application of a GX gradient pulse 68. The RF pulses are shown as sinc pulses which are used to better define the volume of interest. The RF pulses 66 and 67 applied during the application of the GX gradient pulse 68 cause spins in a volume or slab of block 41 to be rotated to be parallel to the ZY transverse plane. Such slabs are termed "saturated". The bandwidths of the RF pulses per gradient amplitude determine the width in the X direction of the slabs saturated by the RF pulse. The frequencies of the RF pulses per gradient amplitude determines the location of the saturated slabs. Two 90 degrees RF pulses are used since it is desired to saturate volumes extending in the ±X direction on both sides of the volume of interest 43.

As shown in FIG. 4, a second pair of 90° RF pulses 69 and 71, are subsequently sequentially applied during the application of a GY gradient pulse 72 to saturate slabs at the top and the bottom of the volume of interest 43; i.e., volumes extending inthe ±Y direction. Thus the slabs are XZ planes having widths in the Y direction. The widths are determined by the bandwidths of the RF pulses. The location of the slabs at the top and bottom of the volume of interest are determined by the frequencies of the applied RF pulses and/or the amplitudes of the gradients.

To assure that the VOI 43 is not saturated, in a preferred embodiment, the transverse magnetization is dephased following each pulse of the sets of RF pulses 66, 67 and 69, 71. This is achieved by continuing the application of each selection gradient pulse after the termination of the RF pulses. To further assure dephasing the transverse magnetization, spoiler gradient pulses are used. The spoiler pulses are shown, for example, as GZ spoiler pulse 73 applied after RF pulse 66 and GZ spoiler pulse 74 applied after RF pulse 67. Further GZ spoiler pulses 76 and 77 are applied after the application of RF pulses 69 and 71 respectively. Orthogonal GY spoiler pulses 78 and 79 are applied after RF pulses 66 and 67 respectively. Similarly, GY spoiler pulses 81 and 82 are applied after RF pulses 69 and 71 respectively.

After the presaturation sequence shown in FIG. 4 the entire block 41 is "saturated" (i.e., the spins are "tipped") except for the VOI 43 which is maintained unsaturated.

Figure 5:
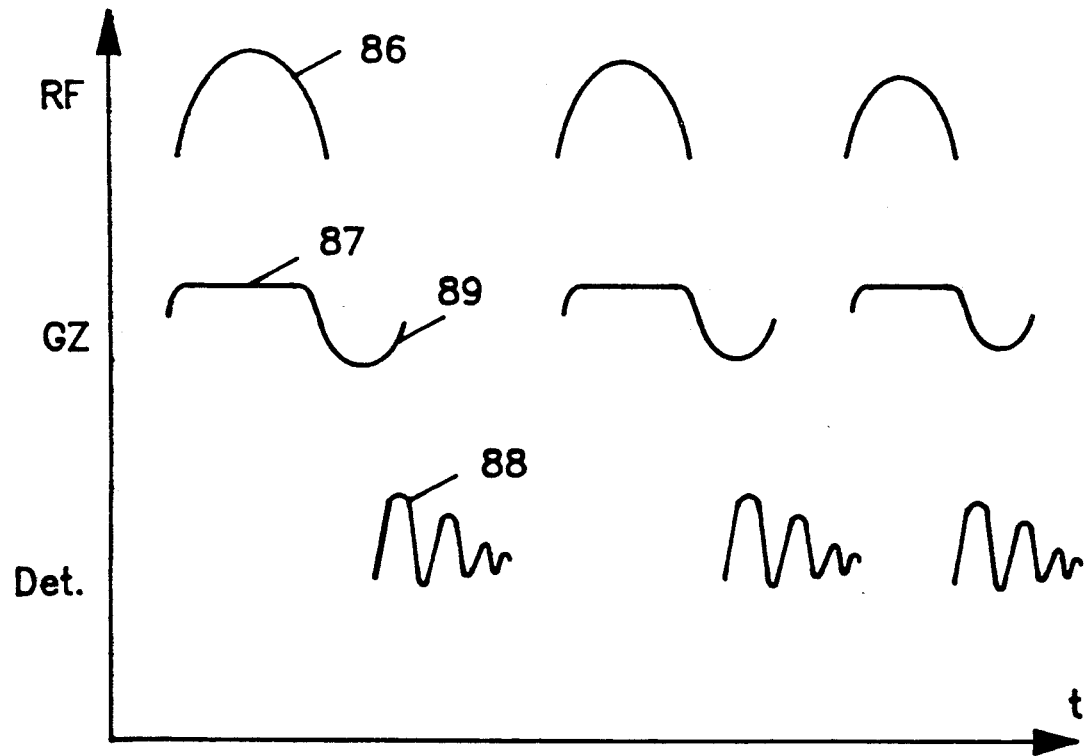
FIG. 5 shows a scan sequence for acquiring spectroscopic data from multi-slices in the section of interest of FIG. 3.

FIG. 5 shows a preferred sequence for obtaining spectroscopic data from the VOI 43. More particulary, as shown in FIG. 5 an RF pulse, preferably a 90° pulse 86, is applied during the application of a GZ gradient pulse 87 to select an XY slab extending in the Z direction, such as for example, slab 61 (also sometimes called slice hereinafter) of volume of interest 43. Radio frequency pulse 86 has a frequency that operates in conjunction with the GZ gradient pulse 87 to cause FID signal 88 to be acquired from slice 61. Note that the pulse is not shown as a sinc pulse to emphasize that a Gaussian pulse or a triangular pulse may be used within the scope of the invention. The gradient pulse 87 is shown as having an opposite-going portion 89 which is used for refocusing purposes.

During spectroscopic data acquisition, it is usual to run somewhere between 100 and 1,000 scan sequences using the same RF and gradient pulse parameters for averaging purposes. Such averaging is necessary to obtain useable signal-to-noise ratios. In multi-slice acquisitions, in addition to the repeat scans for averaging purposes, RF pulses having different frequencies, for example, are used to acquire data from different slices.

Figure 6:
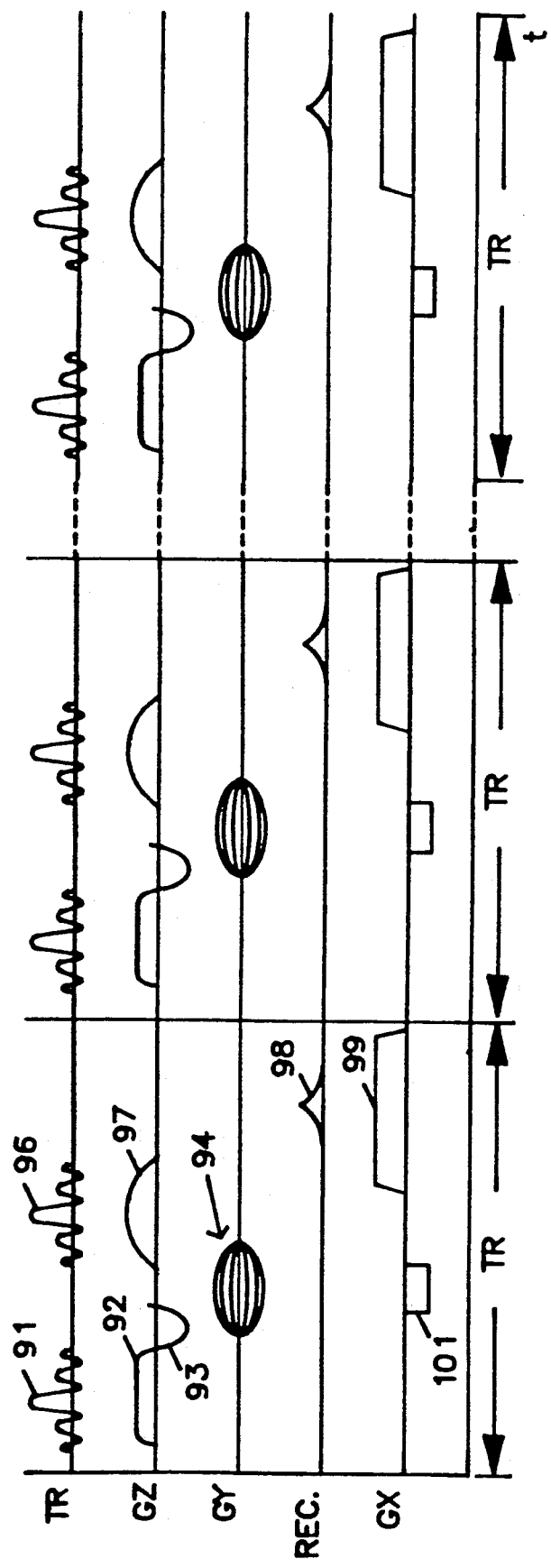
FIG. 6 shows a scan sequence for acquiring imaging data from multi-slices in the section of interest of FIG. 3.

FIG. 6 shows a basic spin echo scan sequence used for obtaining imaging data from a selected slab or slice in the VOI 43. A first, preferably sinc shaped, 90 degree RF pulse 91 is applied during the application of a GZ gradient pulse 92. For refocusing purposes, pulse 92 has an opposite-going portion 93.

A series of phase encoding pulses are applied as shown in 94. Each phase encoding pulse enables acquiring data for a different row of pixels, with each pixel corresponding to similarly positioned area in the slice of the subject. The position of the row depends on the amplitude (phase) of the phase encoding pulse. Subsequently, in a well known manner, a 180° RF pulse 96 is applied, also during application of a plane selecting GZ gradient pulse; i.e., slice 61 in the volume of interest 43. The 180° pulse causes the dephased spins in the selected transverse plane to rephase and form an echo signal shown at 98. A GX gradient pulse 99 is applied during the acquisition of the echo for distinguishing the columns of pixels.

A negative-going GX pulse 101 is applied prior to the application of the 180° RF pulse. The pulse 101 is such that when the volume of the pulse is equal to the volume of pulse 99, then a gradient echo is formed. Ideally, the formation of gradient echo signals and the spin echo signals coincide and reinforce each other. In practice, a number of signals such as signal 98 are acquired and averaged using the same RF and gradient pulse parameters. For the acquisition of data from different slices, different RF pulse and/or gradient pulse parameters are used.

Figure 7:
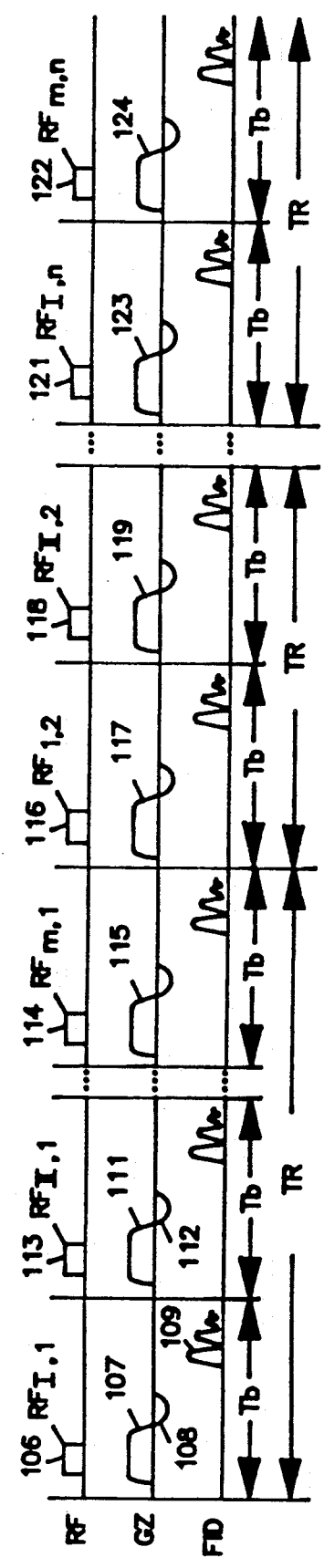
FIG. 7 shows a scan sequence for most efficiently obtaining imaging data from multi-slices in the section of interest, the imaging data acquisition being repeated for averaging purposes.

In a preferred embodiment of the present invention, the sequence for obtaining data from the different slices is run in accordance with FIG. 7. For simplification purposes, FIG. 7 shows the acquisition of FID signals rather than spin echo signals. However, it must be realized that the inventive system applies to the acquisition of echo signals as well as all other types of signals.

In FIG. 7 a first RF pulse RFI,1 designated by reference numeral 106 is applied during the application of gradient pulse 107 having a negative-going portion 108 for refocusing purposes. Responsive to the pulse RFI,1 an FID signal 109 is acquired. Almost as soon as the FID signal is acquired, a new gradient pulse 111 is applied having a negative-going portion 112. During the application of the gradient pulse 111, an RF pulse RFII,1 designated by reference numeral 113 is applied. However, RF pulse 113 with gradient 111 are different than RF pulse 106 and gradient pulse 107 and select slice 62. Thus, the data responsive to RF pulse 113 is from slice 62, for example.

This sequence is repeated until data from each of the slices has been acquired. This is indicated by RFm,1 having reference numeral 114. RFm,1 is the last pulse used during the selection of the different slices such as slices 61, 62 . . . m. Subsequently, RF pulse RFI,2 having a reference numeral 116 is applied. RF pulse 116 has the same parameters as pulse 106. The RF pulse 116 is applied during the application GZ gradient pulse 116 which also has the same parameters as gradient pulse 107. Thus, data for slice 61 is obtained.

The next RF pulse is pulse RFII,2 (reference numeral 118) having the same parameters as pulse 113. It is applied during application of GZ gradient pulse 119 having the same parameters as gradient pulse 111. This sequence continues until the pulse 121 having same parameters as pulse 106 is applied. Similarly, pulses are applied such as pulse 122 which have the same parameters as pulse 114. These pulses are applied during the application of GZ gradient pulses 123 and 124 having the same parameters as pulses 111 and 115, respectively.

The application of the RF pulses and the gradient pulses causes FID signals to be acquired from the different slices which can then be used for imaging or for spectroscopy depending on whether or not phase encoding pulses are applied during the sequence. Imaging require the application of some kind of phase encoding pulses such as shown, for example, in FIG. 6 where the phase encoding pulses 94 are used.

According to the inventive method and apparatus, either spectroscopic or imaging data is acquired from a multiplicity of slices in a volume of interest. The acquisition is accomplished by using a presaturation sequence wherein the volumes not of interest are saturated leaving a volume of interest unsaturated. After the saturation, a data acquisition sequence is applied that generates a plurality of signals from a multiplicity of slices or slabs in the volume of interest.

In the method of the invention, the acquisition of data from a multiciplicity of slices occurs in practically the time required for acquiring data from a single slice. The method enables the acquisition of either spectroscopic data or imaging data that is localized in slices in particular volumes of interest without adverse eddy current effects and with a fine definition of the volume. The power deposition is low because even though the RF pulses have relatively wide bandwidths, fewer such RF pulses are used. The power usage in this described system compared to the power usage in other systems, assures a more efficient system.

The system as described herein can operate with short sequences. Therefore, the system substantially reduces the T1 dependency. The time between the saturation sequence and the data acquisition sequence is varied as required to reduce eddy current effects. Also, the size and location of the slices from which data is acquired in the volume of interest can be varied by varying the bandwidth and/or RF frequency of the pulses and/or strength of the selecting gradients.

While the foregoing invention has been described using preferred embodiment, it should be understood that the preferred embodiments are shown by way of example only and not as limitations on the scope of the invention.

What is claimed is:

1. A method of acquiring multi-slices in a volume of interest (VOI) during a magnetic resonance (MR) examination, said method comprising the steps of:
   determining a VOI in a patient that is a subject of an MR examination,
   subjecting the patient to a strong static magnetic field,
   presaturating volumes surrounding the VOI leaving only the VOI unsaturated,
   said step of presaturating volumes surrounding the VOI comprising the steps of:
   applying a pair of RF pulses during the application of a first gradient pulse to saturate volumes juxtaposed to both sides of the said VOI, and
   applying a second pair of RF pulses during the application of a second gradient pulse to saturate volume juxtaposed to the top and bottom of said VOI,
   selecting multiple slices from the VOI,
   applying radio frequency (RF) pulses to generate free induction decay (FID) signals in the selected multiple slices,
   applying gradient pulses to locate the source of the FID signals, and
   processing the FID signals to provide usable data from the MR examination.

2. A method for acquiring multi-slices in a volume of interest (VOI) during a magnetic resonance (MR) examination, said method comprising the steps of:
   determining a VOI in a patient that is the subject of an MR examination,
   subjecting the patient to a strong static magnetic field,
   presaturating volumes surrounding the VOI leaving only the VOI unsaturated,
   selecting multiple slices from the VOI,
   the step of selecting multiple slices including the steps of:
   applying a basic data acquisition scan sequence to obtain data from a selected one of said multiple slices, said basic data acquisitions scan sequence including applying of an RF pulse in the presence of a slice-selecting gradient pulse,
   said slice-selecting gradient pulse in cooperation with said RF pulse having parameters for selecting and acquiring data from a first slice in said patient,
   waiting a definite period before reapplying said basic sequence, and
   reapplying the basic scan sequence during the definite period with pulses of different parameters for selecting and acquiring data from other slices in said patient during said definite period.

3. A system for acquiring multi-slices in a volume of interest (VOI) during a magnetic resonance (MR) examination, said system comprising:
   means for determining a VOI in a patient that is the subject of an MR examination,
   means for subjecting the patient to a strong static magnetic field,
   means for presaturating volumes surrounding the VOI leaving only the VOI unsaturated,
   means for selecting multiple slices from the VOI,
   said means for selecting multiple slices including:

means for applying a basic data acquisition sequence to obtain data from a selected one of said multiple slices, said means for applying a basic data acquisition scan sequence including means for applying an RF pulse in the presence, of a slice-selecting gradient pulse, said slice-selecting gradient pulse in cooperation with said RF pulse having parameters for selecting and acquiring data from a first slice in said patient, means for waiting a definite period before reapplying said basic sequence, and means for reapplying the basic sequence during the definite period with pulses of different parameters for selecting and acquiring data from other slices in said patient during said definite period, means for applying radio frequency (RF) pulses to generate free induction decay (FID) signals in the selected multiple slices, means for applying gradient pulses to locate the source of the FID signals, and means for processing the FID signals to provide useable data from the MR examination.

4. The method of presaturating volumes surrounding the VOI of claim 1 including the steps of applying spoiler gradient pulses between said RF pulses of said first and said second pair of RF pulses to assure that said VOI remains unsaturated.

5. The method of claim 4 including the step of applying spoiler gradient pulses after the application of each pair of RF pulses.

6. The method of claim 2 wherein said different parameters include different frequencies for said RF pulses.

7. The method of claim 2 wherein said different parameters include gradient pulses of different amplitudes.

8. The method of claim 2 wherein said different parameters include different bandwidths for said RF pulse.

9. The method of claim 2 including applying multiple RF pulses of different frequencies in the presence of different gradient pulses to select multiple slices in the patient, and applying a plurality of RF pulses of the same frequency during the application of gradient pulses of the same amplitudes to obtain a plurality of signals from each of the slabs selected by the multiple RF pulses, and averaging said plurality of signals to obtain a useable signal-to-noise ratio.

10. The methods of claim 2 wherein said RF pulses used for saturation purposes are sets of frequency modulated 90° RF pulses.

11. The method of claim 2 wherein said step of applying a basic scan sequence comprises using a spin echo sequence.

12. The methods of claim 1 wherein said data is spectroscopic data.

13. The methods of claim 1 including the step of applying phase encoding gradient pulses after application of the slab selecting pulses.

14. A system of acquiring multi-slices in a volume of interest (VOI) during a magnetic resonance (MR) examination, said system comprising:

means for determining a VOI in a patient that is the subject of an MR examination, means for subjecting the patient to a strong static magnetic field, means for presaturating volumes surrounding the VOI leaving only the VOI unsaturated, said means for presaturating the volumes surrounding the volume of interest comprises:

means for applying a pair of RF pulses during the application of a first gradient pulse to saturate volumes juxtaposed to both sides of said VOI, and means for applying a second pair of RF pulses during the application of a second gradient pulse to saturate volumes juxtaposed to the top and bottom of said VOI, means for selecting multiple slices from the VOI, means for applying radio frequency (RF) pulses to generate free induction decay (FID) signals in the selected multiple slices, means for applying gradient pulses to locate the source of the FID signals, and means for processing the FID signals to provide useable data from the MR examination.

15. The system of presaturating volumes surrounding the VOI of claim 14 including means for applying spoiler gradient pulses between said RF pulses of said first and said second pair of RF pulses to assure that said VOI remains unsaturated.

16. The system of claim 15 including means for applying spoiler gradient pulses after the application of each pair of RF pulses.

17. The system of claim 3 wherein said different parameters include different frequencies for said RF pulses.

18. The system of claim 3 wherein said different parameters include gradient pulses of different amplitudes.

19. The system of claim 3 wherein said different parameters include different bandwidths for said RF pulses.

20. The method of claim 3 including means for applying multiple RF pulses of different frequencies in the presence of different gradient pulses to select multiple slices in the patient, and means for applying a plurality of RF pulses of the same frequency during the application of gradient pulses of the same amplitudes to obtain a plurality of signals from each of the slabs selected by the multiple RF pulses, and averaging said plurality of signals to obtain a useable signal-to-noise ratio.

21. The system of claim 3 wherein said RF pulses used for saturation purposes are sets of frequency modulated 90° RF pulses.

22. The system of claim 3 wherein said means for applying a basic scan sequence comprises means for applying a spin echo sequence.

23. The system of claim 14 wherein said data is spectroscopic data.

24. The system of claim 14 including means for applying phase encoding gradient pulses after application of the slice selecting pulses to acquire imaging data.

* * * * *